(12) United States Patent
Kim et al.

(10) Patent No.: US 9,898,363 B2
(45) Date of Patent: Feb. 20, 2018

(54) DATA STORAGE DEVICE AND OPERATING METHOD THEREOF

(71) Applicant: SK hynix Inc., Gyeonggi-do (KR)

(72) Inventors: Jae Bum Kim, Gyeonggi-do (KR); Hyung Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/140,251

(22) Filed: Apr. 27, 2016

(65) Prior Publication Data
US 2017/0168894 A1    Jun. 15, 2017

(30) Foreign Application Priority Data
Dec. 9, 2015    (KR) .................. 10-2015-0175153

(51) Int. Cl.
| | | |
|---|---|---|
| H03M 13/29 | (2006.01) | |
| G06F 11/10 | (2006.01) | |
| G11C 29/52 | (2006.01) | |
| G11C 7/00 | (2006.01) | |

(52) U.S. Cl.
CPC .......... *G06F 11/1068* (2013.01); *G11C 29/52* (2013.01); *G11C 7/00* (2013.01)

(58) Field of Classification Search
CPC .................................. H03M 13/2957
USPC ......................... 714/755, 752, 757
See application file for complete search history.

(56) References Cited

U.S. PATENT DOCUMENTS

| | | | |
|---|---|---|---|
| 7,844,879 B2 * | 11/2010 | Ramamoorthy | G06F 11/1068 365/185.09 |
| 2013/0132804 A1 | 5/2013 | Frayer et al. | |
| 2015/0169406 A1 * | 6/2015 | Li | G06F 11/1012 714/763 |

FOREIGN PATENT DOCUMENTS

KR    1020090117213    11/2009

* cited by examiner

*Primary Examiner* — Fritz Alphonse
(74) *Attorney, Agent, or Firm* — IP & T Group LLP (57) ABSTRACT

A data storage device includes a first decoder suitable for performing first ECC decoding operation; a second decoder suitable for performing second ECC decoding operation; and a control unit suitable for controlling the first decoder to perform the first ECC decoding operation to data chunks read from a memory region respectively according to read voltage sets, and performing one of prioritization, reservation and omission of the second ECC decoding operation to a current data chunk when the first ECC decoding operation to the current data chunk fails.

20 Claims, 6 Drawing Sheets

| RRT | SDR | First decoding | Second decoding | |
|-----|-----|----------------|-----------------|---|
|     |     |                | (Prioritized)   | (Reserved) |
| R0  | H   | D0 ↓           | X               | X |
| R1  | L   | D1 ──────→     | D1 ──────→      | Decoding success |
| R2  |     |                |                 |   |
| R3  |     |                |                 |   |
| R4  |     |                |                 |   |

──→ : Decoding sequence
X : Not performed

FIG.5

| RRT | SDR | First decoding | Second decoding | |
|-----|-----|----------------|-----------------|---|
|     |     |                | (Prioritized)   | (Reserved) |
| R0  | H   | D0 ↓           | X               | X |
| R1  | L   | D1 ──────→     | D1              | X |
| R2  | M   | D2 ↓           | X               | ⟨D2⟩ ──→ Decoding success |
| R3  | M   | D3 ↓           | X               | ⟨D3⟩ |
| R4  | H   | D4             | X               | X |

──→ : Decoding sequence
⟨⟩ : Reserved
X : Not performed

DATA STORAGE DEVICE AND OPERATING METHOD THEREOF

CROSS-REFERENCES TO RELATED APPLICATION

The present application claims priority under 35 U.S.C. § 119(a) to Korean application number 10-2015-0175153, filed on Dec. 9, 2015, in the Korean Intellectual Property Office, which is incorporated herein by reference in its entirety.

BACKGROUND

1. Technical Field

Various embodiments generally relate to a data storage device, and, more particularly, to a data storage device capable of performing an improved error correction operation.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices can be embedded in external devices or fabricated separately and then connected afterwards.

As the integration density of data storage devices continues to increase in order to satisfy consumer demand for higher storage capacity portable electronic devices, the probability of erroneously read data increases. Hence, although error correction decoding circuits and schemes are well known in the art, recently there has been an increased need for data storage devices with improved error correction performance.

SUMMARY

In an embodiment, a data storage device may include: a first decoder suitable for performing first ECC decoding operation; a second decoder suitable for performing second ECC decoding operation; and a control unit suitable for controlling the first decoder to perform the first ECC decoding operation to data chunks read from a memory region respectively according to read voltage sets, and performing one of prioritization, reservation and omission of the second ECC decoding operation to a current data chunk when the first ECC decoding operation to the current data chunk fails.

In an embodiment, a method for operating a data storage device may include: performing first ECC decoding operation to data chunks read from a memory region respectively according to read voltage sets; and performing one of prioritization, reservation and omission of the second ECC decoding operation to a current data chunk when the first ECC decoding operation to the current data chunk fails.

In an embodiment, a method for operating a data storage device may include: performing first ECC decoding operation to a memory region according to a current one among read voltage sets; and performing the first ECC decoding operation according to remaining read voltage sets or second ECC decoding operation according to the current read voltage set based on a syndrome weighting corresponding to the current read voltage set when the first ECC decoding operation according to the current read voltage set fails.

DETAILED DESCRIPTION

Hereinafter, various embodiments of the present invention including a data storage device and an operating method thereof will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
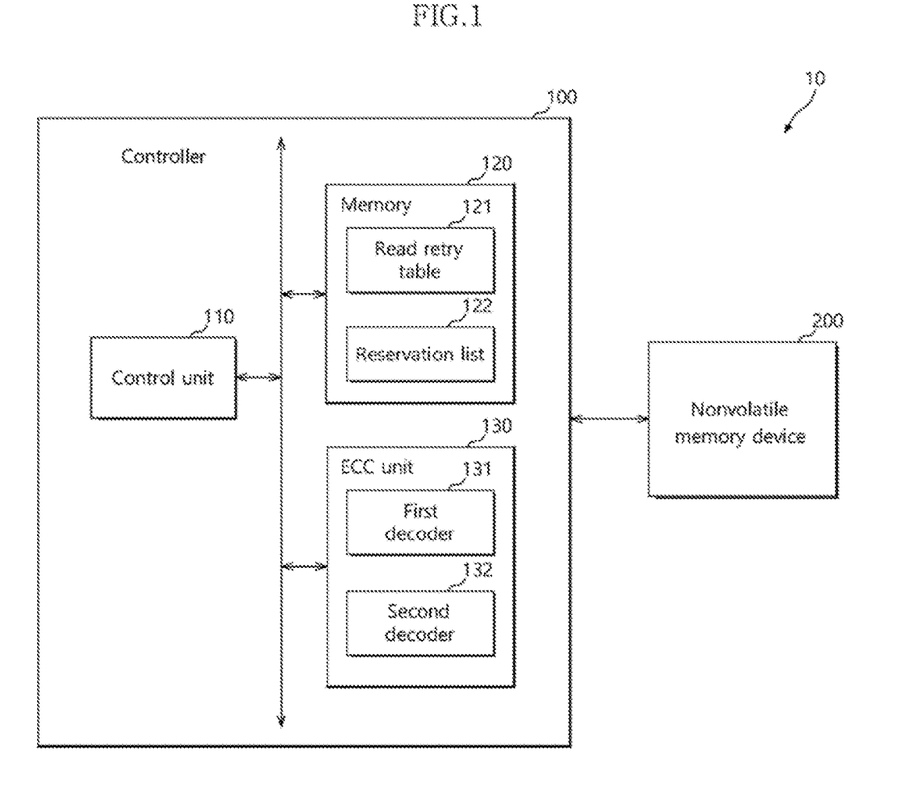
FIG. 1 is a block diagram illustrating a representation of an example of a data storage device according to an embodiment of the invention.

FIG. 1 is a block diagram illustrating a data storage device in accordance with an embodiment.

The data storage device 10 may be configured to store data provided from an external device, in response to a write request from the external device. Also, the data storage device 10 may be configured to provide stored data to the external device, in response to a read request from the external device.

The data storage device 10 may be configured by a Personal Computer Memory Card International Association (PCMCIA) card, a compact flash (CF) card, a smart media card, a memory stick, a multimedia card (MMC), an embedded MMC (eMMC), a reduced-size multimedia card (RS-MMC) and a micro-size version of MMC (MMC-micro), a secure digital (SD) card, a mini secure digital (mini-SD) and a micro secure digital (micro-SD), a universal flash storage (UFS), or a solid state drive (SSD).

The data storage device 10 may include a controller 100 and a nonvolatile memory device 200.

The controller 100 may include a control unit 110, a memory 120, and an error correction code (ECC) unit 130.

The control unit 110 may control general operations of the data storage device 10. The control unit 110 may store data in the nonvolatile memory device 200 in response to a write request transmitted from the external device, and may read data stored in the nonvolatile memory device 200 and output the read data to the external device in response to a read request transmitted from the external device.

The control unit 110 may control the ECC unit 130 to perform ECC decoding operation to a data chunk, which is an objective unit of the ECC decoding operation, transmitted from the nonvolatile memory device 200.

When the decoding of the ECC unit 130 fails, the control unit 110 may change read voltages for a read operation of the nonvolatile memory device 200, and acquire a new data chunk read from the same memory region according to the changed read voltages by controlling the nonvolatile memory device 200. The control unit 110 may select one of read voltage sets. Locations and numbers of error bits in the data chunk may depend on the read voltage sets according to which the data chunk is read out from the same memory region. Locations and numbers of error bits in the data chunk read out from the same memory region according to first and second read voltage sets may be different from each other. The control unit 110 may control the ECC unit 130 to iteratively perform the ECC decoding operation to the data chunk read out from the same memory region according to various read voltage sets until the ECC decoding operation succeeds. The above-described series of operations of the control unit 110 may be referred to as a read retry operation.

As will be described later in detail, the control unit 110 may schedule the ECC decoding operations of first and second decoders 131 and 132 having different performances during the read retry operation. Accordingly, a number of the ECC decoding operations may be decreased while the success rate of the ECC operations is increased.

The memory 120 may serve as a working memory, a buffer memory or a cache memory of the control unit 110. The memory 120 as a working memory may store software programs and various program data to be driven by the control unit 110. The memory 120 as a buffer memory may buffer data transmitted between the external device and a storage medium. The memory 120 as a cache memory may temporarily store cache data.

The memory 120 may store a read retry table 121 including the various read voltage sets and a reservation list 122, which are referred to by the control unit 110 during the read retry operation.

The ECC unit 130 may include the first decoder 131 and the second decoder 132.

The first and second decoders 131 and 132 may respectively perform first ECC decoding operation and second ECC decoding operation to the data chunk to detect and correct error bits in the data chunk under the control of the control unit 110. The first and second decoders 131 and 132 may perform respective ECC decoding operations of different algorithms. The first algorithm may have characteristics such as lower hardware complexity, lower power consumption and lower decoding latency than the second algorithm. The second algorithm may have characteristics such as higher hardware complexity, higher power consumption and higher decoding latency than the first algorithm, but have more excellent error correction capability than the first algorithm. For the LDPC (low density parity check) decoding operation with the LDPC codes, the first decoder 131 may perform the first ECC decoding operation according to, for example, a BF (bit flipping) algorithm, and the second decoder 132 may perform the second ECC decoding operation according to, for example, a min-sum algorithm. However, it is to be noted that the invention is not limited to such.

While not shown, the ECC unit 130 may further include an encoder for encoding data. For example, the encoder may encode data based on LDPC.

During the LDPC decoding operation, the data chunk may be determined to have error bits based on the syndrome vector, which is the product of the parity check matrix and the data chunk vector. When the syndrome vector includes all zero ("0") elements, the data chunk is determined as error-free. When the syndrome vector includes one or more non-zero elements, the data chunk is determined to have the error bits.

A syndrome weighting may be obtained by cumulating elements of the syndrome vector. The greater the syndrome weighting, the higher the probability of the error bits in the corresponding data chunk and the greater the number of the error bits in the corresponding data chunk.

Figure 2:
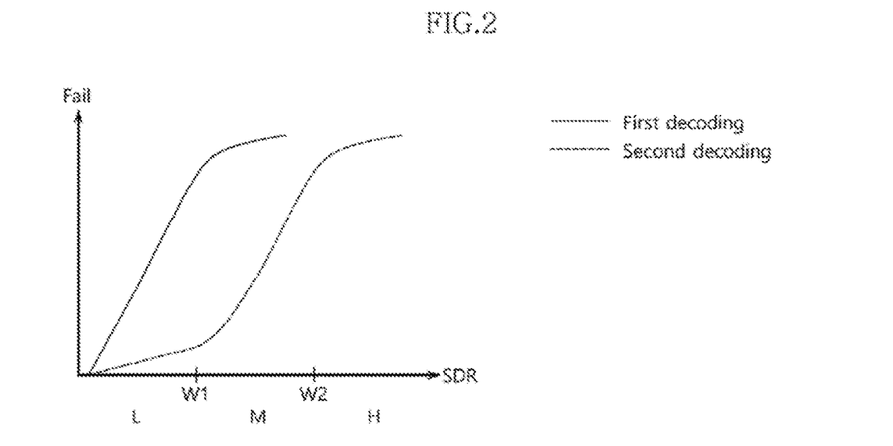
FIG. 2 is a representation of an example of a graph to assist in the explanation of probabilities of first and second ECC decoding operations to fail for syndrome weightings.

FIG. 2 is a representation of an example of a graph to assist in the explanation of probabilities of first and second ECC decoding operations to fail for syndrome weightings. In the graph of FIG. 2, the horizontal axis may represent a syndrome weighting SDR, and the vertical axis may represent a fail probability of the ECC decoding operation.

As exemplified in FIG. 2, first to third ranges L, M and H may be defined on the basis of first and second threshold values W1 and W2 for syndrome weightings SDR. The first and second threshold values W1 and W2 may be predetermined according to performances of the first and second algorithms.

As can be seen from the heuristically obtained graph of FIG. 2, the syndrome weighting SDR may be used to predict whether the first and second ECC decoding operation to the data chunk will succeed. For example as illustrated in FIG. 2, the syndrome weighting SDR in the first range L represents a medium success probability of the first ECC decoding operation and a high success probability of the second ECC decoding operation. The syndrome weighting SDR in the second range M represents a low success probability of the first ECC decoding operation and a medium success probability of the second ECC decoding operation. The syndrome weighting SDR in the third range H represents a very low success probability of the first ECC decoding operation and a very low success probability of the second ECC decoding operation. The control unit 110 may include information of the first to third ranges L, M and H of the syndrome weighting SDR.

Referring again to FIG. 1, the control unit 110 may schedule the first and second ECC decoding operations based on a syndrome weighting.

The control unit 110 may control the first decoder 131 to perform the first ECC decoding operation to respective data chunks read from a memory region based on respective read voltage sets selected from the read retry table 121, and may schedule the second ECC decoding operation to the respective data chunks based on syndrome weightings corresponding to the respective data chunks. The syndrome weightings corresponding to the respective data chunks may be obtained during the failed first ECC decoding operation to the respective data chunks, and thus the control unit 110 may identify one of the first to third ranges L, M and H, which the syndrome weighting corresponding to the data chunk falls in, when the first ECC decoding operation to the data chunks fails.

When the first ECC decoding operation to a current data chunk corresponding to a current read voltage set selected from the read retry table 121 fails, the control unit 110 may prioritize the second ECC decoding operation to the current data chunk according to the current read voltage set prior to remaining iteration of the first ECC operation according to remaining read voltage sets, may reserve the second ECC decoding operation to the current data chunk according to the current read voltage set to be performed after completion of the iteration of the first ECC operation according to the remaining read voltage sets, or may omit the second ECC decoding operation to the current data chunk according to the current read voltage set after completion of the iteration of the first ECC operation according to the remaining read voltage sets. That is, the control unit 110 may select one of prioritization, reservation and omission of the second ECC decoding operation to the current data chunk according to the current read voltage set when the first ECC decoding operation to the current data chunk corresponding to the current read voltage set fails.

In detail, when the syndrome weighting falls in the first range L, the control unit 110 may control the second decoder 132 to perform the second ECC decoding operation to the current data chunk prior to the remaining iteration of the first ECC operation according to remaining read voltage sets.

When the syndrome weighting falls in the second range M, the control unit 110 may reserve the second ECC decoding operation to the current data chunk according to the current read voltage set to be performed after completion of the iteration of the first ECC operation according to the remaining read voltage sets. When the first ECC decoding operation according to the remaining read voltage sets included in the read retry table 121, the control unit 110 may control the second decoder 132 to perform the reserved second ECC decoding operation. When the first ECC decoding operation according to the remaining read voltage sets included in the read retry table 121 succeeds, then the control unit 110 may control the second decoder 132 to not perform the reserved second ECC decoding operation. When reserving the second ECC decoding operation, the control unit 110 may add information on the current read voltage set to the reservation list 122.

When the syndrome weighting falls in the third range H, the control unit 110 may control the second decoder 132 not to perform the second ECC decoding operation to the current data chunk according to the current read voltage set even after completion of the iteration of the first ECC operation according to the remaining read voltage sets.

The nonvolatile memory device 200 may include a flash memory device such as a NAND flash or a NOR flash, an FeRAM (ferroelectric random access memory), a PCRAM (phase change random access memory), an MRAM (magnetic random access memory) or an ReRAM (resistive random access memory).

The nonvolatile memory device 200 may store data transmitted from the controller 100 and may read stored data and transmit read data to the controller 100, according to control of the controller 100.

Figure 3:
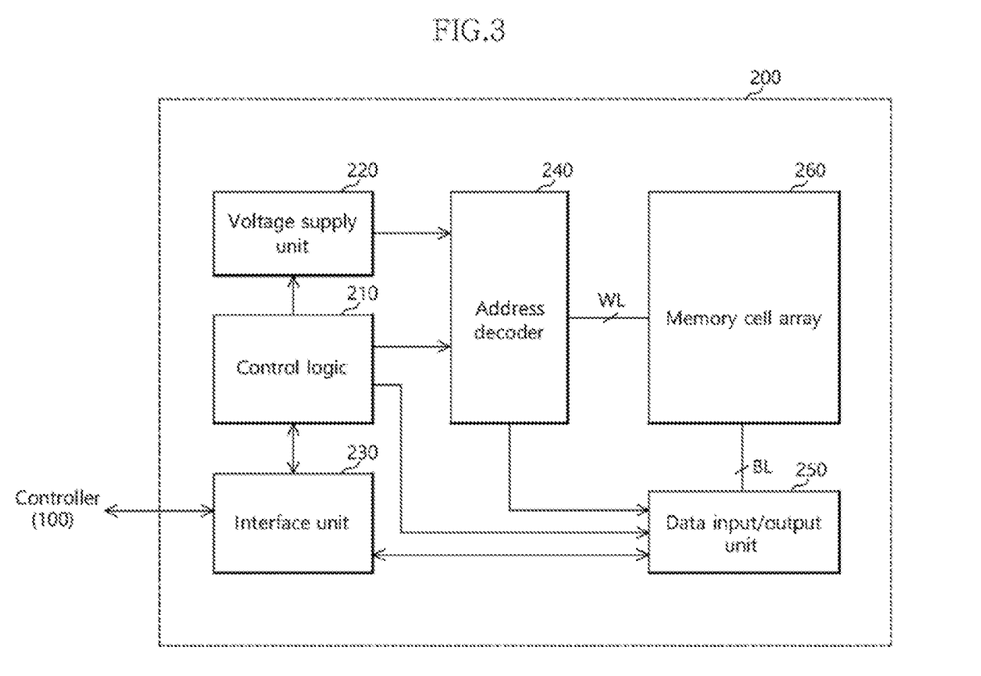
FIG. 3 is a block diagram illustrating a configuration of the nonvolatile memory device shown in FIG. 1.

FIG. 3 is a block diagram illustrating a representation of an example of the detailed configuration of the nonvolatile memory device 200 shown in FIG. 1.

The nonvolatile memory device 200 may include a control logic 210, a voltage supply unit 220, an interface unit 230, an address decoder 240, a data input/output unit 250, and a memory cell array 260.

The control logic 210 may control general operations of the nonvolatile memory device 200 according to control of the controller 100. The control logic 210 may receive a command transmitted from the controller 100, from the interface unit 230, and may transmit control signals to internal units of the nonvolatile memory device 200 in response to the command. The control logic 210 may perform a read operation based on changed read voltages, in response to a command for changing read voltages.

The voltage supply unit 220 may generate various operation voltages necessary for general operations of the nonvolatile memory device 200, according to control of the control logic 210. The voltage supply unit 220 may supply, for example, read voltages for the read operation, to the address decoder 240.

The Interface unit 230 may exchange various control signals including commands and addresses and data with the controller 100. The interface unit 230 may transmit various control signals and data inputted thereto, to the internal units of the nonvolatile memory device 200.

The address decoder 240 may decode addresses to select portions to be accessed in the memory cell array 260. The address decoder 240 may selectively drive word lines WL and control the data input/output unit 250 to selectively drive bit lines BL, according to decoding results.

The data input/output unit 250 may transmit data transmitted from the interface unit 230, to the memory cell array 260 through the bit lines BL. The data input/output unit 250 may transmit data read from the memory cell array 260 through the bit lines BL, to the interface unit 230. The data input/output unit 250 may acquire data stored in memory cells included in the memory cell array 260, by sensing current formed as the memory cells are turned on or off in response to read voltages.

The memory cell array 260 may be coupled with the address decoder 240 through the word lines WL, and may be coupled with the data input/output unit 250 through the bit lines BL. The memory cell array 260 may include a plurality of memory cells which are respectively disposed at areas where the word lines WL and the bit lines BL intersect with each other and in which data are stored. The memory cell array 260 may be formed to have a 2-dimensional or 3-dimensional structure.

Figure 4:
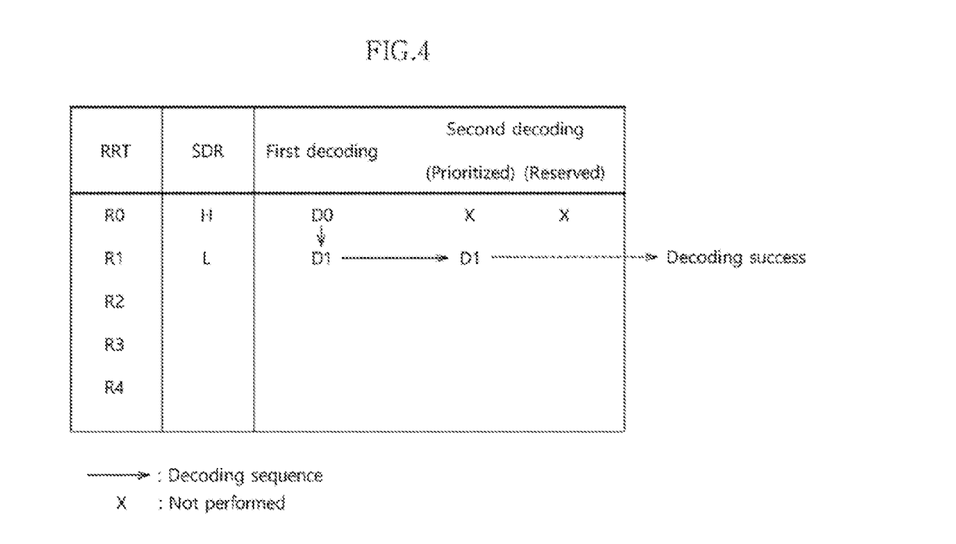
FIGS. 4 and 5 are diagrams illustrating the exemplary explanation of a method for the data storage device of FIG. 1 to perform a read retry operation.
Figure 5:
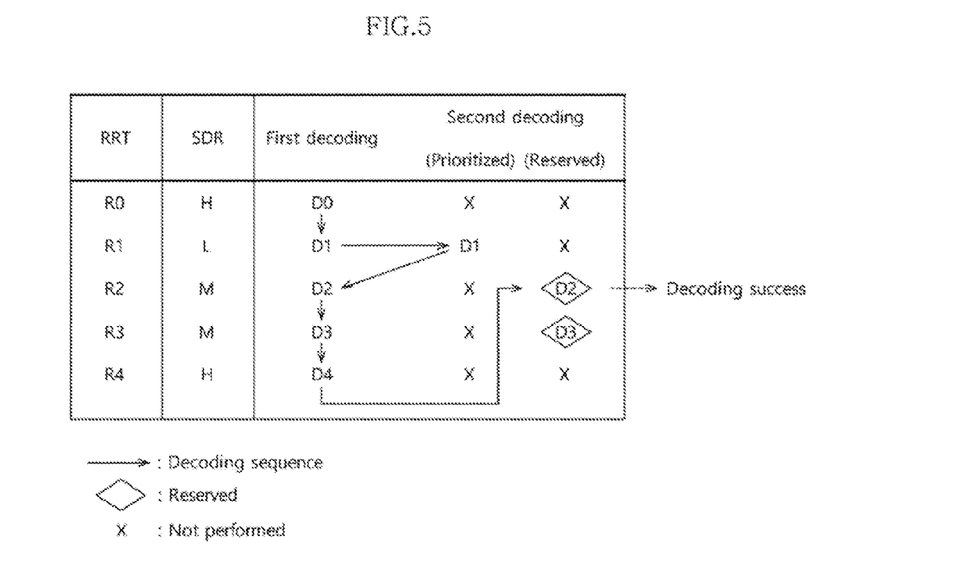

FIGS. 4 and 5 are diagrams illustrating a method for the data storage device 10 of FIG. 1 to perform the read retry operation. Referring to FIGS. 4 and 5, the control unit 110 may perform the read retry operation by referring to the read retry table 121 including read voltage sets R0 to R4.

Referring to FIG. 4, the first ECC decoding operation may be performed to a data chunk D0 read from a memory region based on the read voltage set R0. When the first ECC decoding operation to the data chunk D0 fails, the second ECC decoding operation to the data chunk D0 may be scheduled based on the syndrome weighting SDR corresponding to the data chunk D0. As described above, the syndrome weighting SDR corresponding to the data chunk D0 may be obtained during the failed first ECC decoding operation to the data chunk D0, and thus the control unit 110 may identify one of the first to third ranges L, M and H, which the syndrome weighting SDR corresponding to the data chunk D0 falls in, when the first ECC decoding operation to the data chunk D0 fails. When the syndrome weighting SDR corresponding to the data chunk D0 falls in the third range H representing a very low success probability of the second ECC decoding operation to the data chunk D0 according to the read voltage set R0, the second ECC decoding operation to the data chunk D0 may be omitted because of a high probability of failure. Accordingly, the second ECC decoding operation to the data chunk D0 may not be prioritized or reserved. The control unit 110 may control the second decoder 132 not to perform the second ECC decoding operation to the data chunk D0 according to the current read voltage set R0 even after completion of the iteration of the first ECC operation according to the remaining read voltage sets R1 to R4.

Then, the first ECC decoding operation may be performed for a data chunk D1 read from the same memory region according to the read voltage set R1. When the first ECC decoding operation to the data chunk D0 fails, the second ECC decoding operation to the data chunk D1 may be scheduled based on the syndrome weighting SDR corresponding to the data chunk D1. When the syndrome weighting SDR corresponding to the data chunk D1 falls in the first range L representing a high success probability of the second ECC decoding operation to the data chunk D1 according to the read voltage set R1, the second ECC decoding operation to the data chunk D1 may be prioritized over the remaining iteration of the first ECC operation according to remaining read voltage sets R2 to R4.

The second ECC decoding operation may be performed to the data chunk D1 read from the same memory region based on the read voltage set R1. When the second ECC decoding operation to the data chunk D1 succeeds, the error-corrected data chunk D1 may be outputted, and the read retry operation may be ended.

Referring to FIG. 5, the first ECC decoding operation may be performed to a data chunk D0. When the first ECC decoding operation to the data chunk D0 fails, the second ECC decoding operation to the data chunk D0 may be scheduled based on the syndrome weighting SDR corresponding to the data chunk D0. When the syndrome weighting SDR corresponding to the data chunk D0 falls in the third range H representing a very low success probability of the second ECC decoding operation to the data chunk D0 according to the read voltage set R0, the second ECC decoding operation to the data chunk D0 may be omitted because of a high probability of failure. Accordingly, the second ECC decoding operation to the data chunk D0 may not be prioritized or reserved.

Then, the first ECC decoding operation may be performed for a data chunk D1 read from the same memory region according to the read voltage set R1. When the first ECC decoding operation to the data chunk D1 fails, the second ECC decoding operation to the data chunk D1 may be scheduled based on the syndrome weighting SDR corresponding to the data chunk D1. When the syndrome weighting SDR corresponding to the data chunk D1 falls in the first range L representing a high success probability of the second ECC decoding operation to the data chunk D1 according to the read voltage set R1, the second ECC decoding operation to the data chunk D1 may be performed to the data chunk D1 read from the same memory region based on the read voltage set R1 prior to the remaining iteration of the first ECC operation according to remaining read voltage sets R2 to R4. When the second ECC decoding operation to the data chunk D1 fails, the remaining iteration of the first ECC operation according to remaining read voltage sets R2 to R4 may be performed.

Accordingly, the first ECC decoding operation may be sequentially performed to the data chunks D2 and D3 respectively read from the same memory region according to the read voltage sets R2 and R3. When each of the first ECC decoding operations to the data chunks D2 and D3 fail, each of the second ECC decoding operations to the data chunks D2 and D3 may be scheduled based on the syndrome weightings SDRs corresponding to the data chunks D2 and D3. When each of the syndrome weightings SDRs corresponding to the data chunks D2 and D3 falls in the second range M representing a medium success probability of the second ECC decoding operations to the data chunks D2 and D3 respectively according to the read voltage sets R2 and R3, each of the second ECC decoding operations to the data chunks D2 and D3 may not be prioritized but reserved. The control unit 110 may control the second decoder 132 to sequentially perform the second ECC decoding operations to the data chunks D2 and D3 according to the current read voltage sets R2 and R3 after completion of the iteration of the first ECC operation according to the remaining read voltage set R4.

Then, the first ECC decoding operation may be performed to a data chunk D4. When the first ECC decoding operation to the data chunk D4 fails, the second ECC decoding operation to the data chunk D4 may be scheduled based on the syndrome weighting SDR corresponding to the data chunk D4. When the syndrome weighting SDR corresponding to the data chunk D4 falls in the third range H representing a very low success probability of the second ECC decoding operation to the data chunk D4 according to the read voltage set R4, the second ECC decoding operation to the data chunk D4 may be omitted because of a high probability of failure. Accordingly, the second ECC decoding operation to the data chunk D4 may not be prioritized or reserved.

After completion of all iteration of the first ECC operation to the data chunks D0 to D4 according to all read voltage sets R0 to R4, the control unit 110 may control the second decoder 132 to sequentially perform the second ECC decoding operations to the data chunks D2 and D3 according to the read voltage sets R2 and R3.

Accordingly, the second ECC decoding operation may be performed to the data chunk D2 read from the same memory region based on the read voltage set R2. When the second ECC decoding operation to the data chunk D2 succeeds, the error-corrected data chunk D2 may be outputted, and the read retry operation may be ended.

In summary, when the syndrome weighting SDR for a current data chunk represents a high success probability of the second ECC decoding operation to the current data chunk according to the current read voltage set, the control unit 110 may prioritize the second ECC decoding operation to the current data chunk according to the current read voltage set prior to remaining iteration of the first ECC operation according to remaining read voltage sets. When the prioritized second ECC decoding operation succeeds, there is no need to perform the remaining iteration of the first ECC operation according to remaining read voltage sets. Therefore, the read retry operation may be completed quickly.

Further, when the syndrome weighting SDR for a current data chunk represents a very low success probability of the second ECC decoding operation to the current data chunk according to the current read voltage set, the control unit 110 may omit the second ECC decoding operation to the current data chunk because of a high probability of failure. Accordingly, after completion of all iteration of the first ECC operation to the data chunks according to all read voltage sets, there is no need to perform the omitted second ECC decoding operation. Therefore, the read retry operation may be completed quickly.

Figure 6:
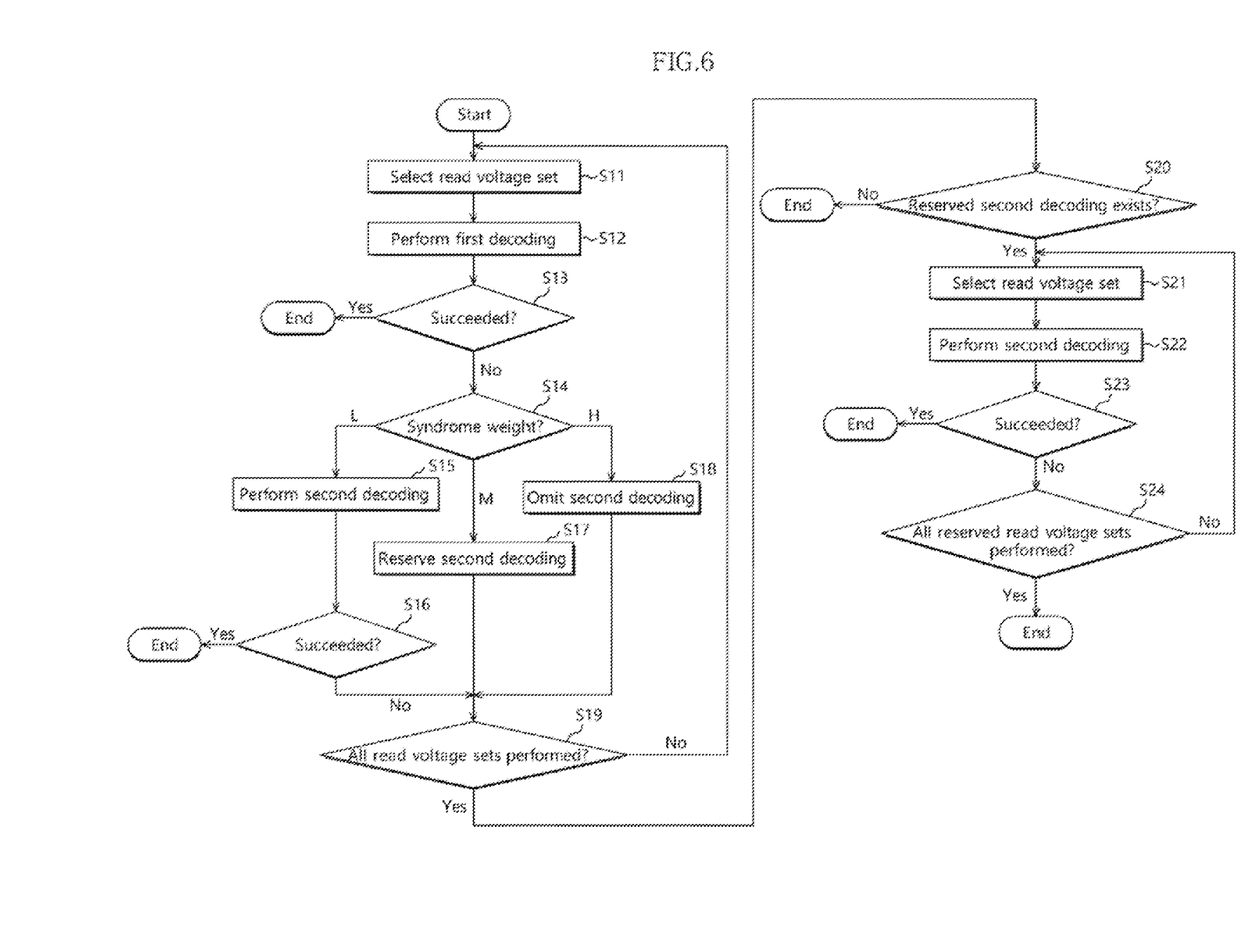
FIG. 6 is a flow chart of a method for operating the data storage device of FIG. 1.

FIG. 6 is a representation of an example of a flow chart to assist in the explanation of a method for operating the data storage device 10 of FIG. 1.

Referring to FIGS. 1 to 6, at step S11, the control unit 110 may read a data chunk (i.e. one of the data chunks D0 to D4) from a memory region of the nonvolatile memory device 200 according to one among the read voltage sets (i.e., the read voltage sets R0 to R4) in the read retry table 121.

At step S12, the control unit 110 may control the first decoder 131 to perform the first ECC decoding operation to the current data chunk.

At step S13, the control unit 110 may determine whether the first ECC decoding operation succeeds. When the first ECC decoding operation succeeds, the process may be ended. When the first ECC decoding operation fails, the process may proceed to step S14.

At the step S14, the control unit 110 may determine in which range a syndrome weighting SDR corresponding to the current data chunk falls among the first to third ranges L, M and H. As described above, the syndrome weighting SDR corresponding to the current data chunk may be obtained during the failed first ECC decoding operation to the current data chunk, and thus the control unit 110 may identify one of the first to third ranges L, M and H, which the syndrome weighting SDR corresponding to the current data chunk falls in, when the first ECC decoding operation to the current data chunk fails. According to which range among the first to third ranges L, M and H the syndrome weighting SDR falls in, the process may proceed to steps S15, S17 and S18, respectively.

At the step S15 when the syndrome weighting SDR corresponding to the current data chunk falls in the first range L representing a high success probability of the second ECC decoding operation to the current data chunk according to the current read voltage set, the control unit 110 may prioritize the second ECC decoding operation to the current data chunk according to the current read voltage set prior to the remaining iteration of the first ECC operation according to the remaining read voltage sets.

At step S16, the control unit 110 may determine whether the second ECC decoding operation to the current data chunk succeeds. When the second ECC decoding operation to the current data chunk succeeds, the process may be ended. When the second ECC decoding operation to the current data chunk fails, the process may proceed to step S19.

At the step S17, when the syndrome weighting SDR corresponding to the current data chunk falls in the second range M representing a medium success probability of the second ECC decoding operation to the current data chunk according to the current read voltage set, the control unit 110 may reserve the second ECC decoding operation to the current data chunk according to the current read voltage set by adding the information on the current read voltage set to the reservation list 122.

At the step S18, when the syndrome weighting SDR corresponding to the current data chunk falls in the third range H representing a very low success probability of the second ECC decoding operation to the current data chunk according to the current read voltage set, the control unit 110 may omit the second ECC decoding operation to the current data chunk according to the current read voltage set.

At the step S19, the control unit 110 may determine whether all iteration of the first ECC decoding operation according to all read voltage sets of the read retry table 121 is completed. In the case where all iteration of the first ECC decoding operation according to all read voltage sets of the read retry table 121 is not completed yet, the controller may repeat steps S11 to S19 according to the remaining read voltage sets of the read retry table 121. In the case where all iteration of the first ECC decoding operation according to all read voltage sets of the read retry table 121 is completed, that is, in the case where the first ECC decoding operation fails for all the data chunks, the process may proceed to step S20.

At the step S20, the control unit 110 may determine whether the second ECC decoding operation reserved by step S17, that is, whether the reservation list 122 includes the information on at least one read voltage set added by step S17. In the case where the reserved second ECC decoding operation does not exist, the process may be ended. In the case where the reserved second ECC decoding operation exists, the process may proceed to step S21.

At the step S21, the control unit 110 may select one among the read voltage sets included the reservation list 122. The control unit 110 may sequentially select the read voltage sets in order of addition of the read voltage sets into the reservation list 122. The control unit 110 may read the data chunk from the memory region of the nonvolatile memory device 200 according to the read voltage set selected from the reservation list 122. According to an embodiment, as the data chunk, the control unit 110 may use the data chunk retained in a separate region during step S17.

At step S22, the control unit 110 may control the second decoder 132 to perform the second ECC decoding operation to the data chunk according to the selected read voltage set.

At step S23, the control unit 110 may determine whether the second ECC decoding operation according to the selected read voltage set succeeds. When the second ECC decoding operation succeeds, the process may be ended. When the second ECC decoding operation fails, the process may proceed to step S24.

At the step S24, the control unit 110 may determine whether all iteration of the second ECC decoding operation according to all read voltage sets of the reservation list 122 is completed. In the case where all iteration of the second ECC decoding operation according to all read voltage sets of the reservation list 122 is not completed yet, the controller may repeat steps S21 to S24 according to the remaining read voltage sets of the reservation list 122. In the case where all iteration of the second ECC decoding operation according to all read voltage sets of the reservation list 122 is completed, the process may be ended.

Figure 7:
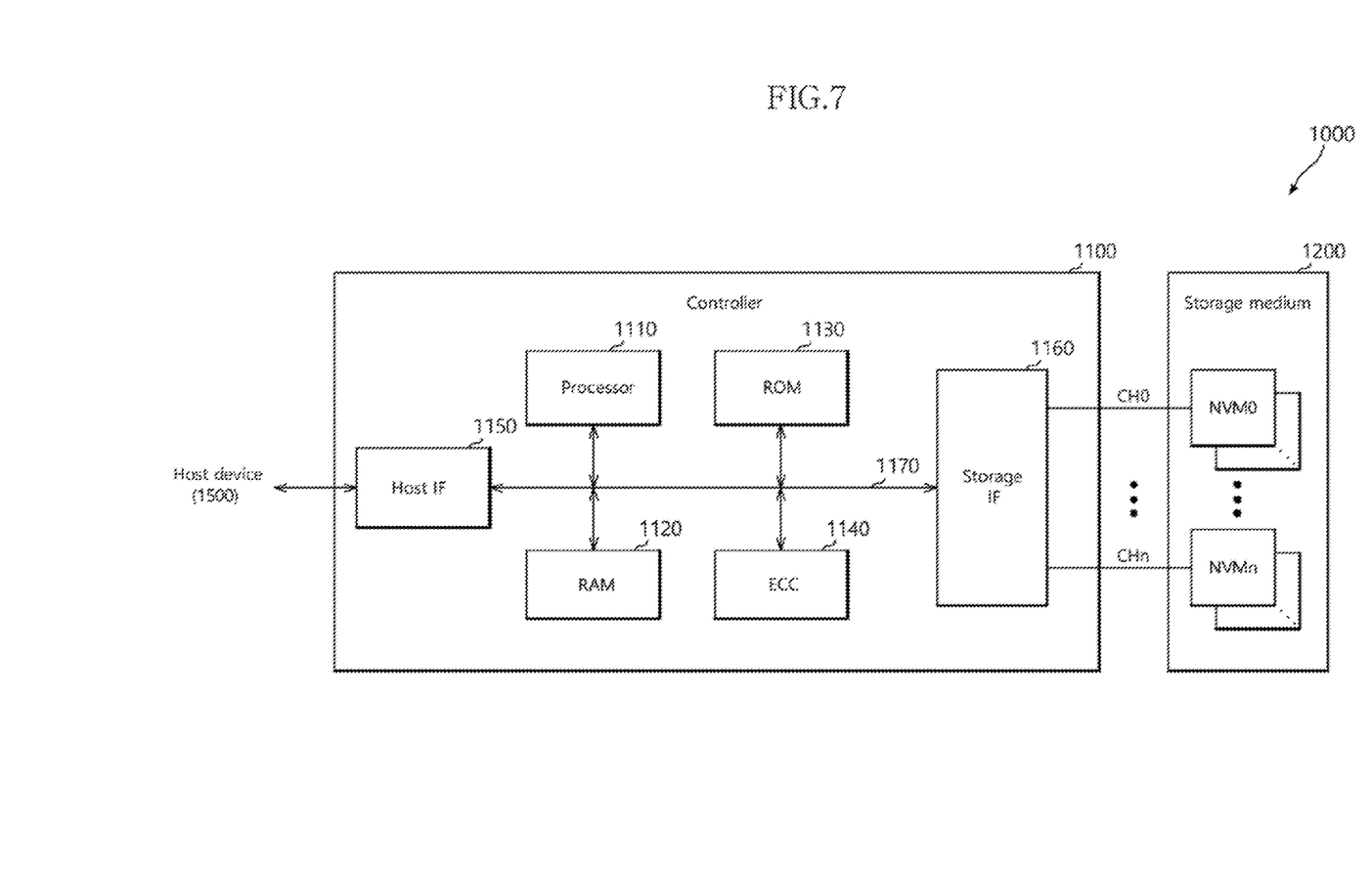
FIG. 7 is a block diagram illustrating a solid state drive (SSD) according to an embodiment of the invention.

FIG. 7 is a block diagram illustrating a solid state drive (SSD) 1000 according to an embodiment.

The SSD 1000 may include a controller 1100 and a storage medium 1200.

The controller 1100 may control data exchange between a host device 1500 and the storage medium 1200. The controller 1100 may include a processor 1110, a RAM 1120, a ROM 1130, an ECC unit 1140, a host interface 1150, and a storage medium interface 1160.

The processor 1110 may control general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

Also, the processor 1110 may operate in a manner substantially similar to the control unit 110 shown in FIG. 1. The processor 1110 may control the ECC unit 1140 in such a manner that, when a read retry operation is performed, by scheduling first and second ECC decoding operations, second ECC decoding operation having different performances based on syndrome weightings, decoding to succeed with a high probability is performed preferentially and unnecessary decoding is omitted. The second ECC decoding operation may have different performances based on syndrome weightings.

The RAM 1120 may store programs and program data to be used by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm. Like the ECC unit 130 shown in FIG. 1, the ECC unit 1140 may include decoders having different performances.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CHO to CHn.

The storage medium 1200 may include a plurality of nonvolatile memory devices NVM0 to NVMn. Each of the plurality of nonvolatile memory devices NVM0 to NVMn may perform a write operation and a read operation according to the control of the controller 1100.

Figure 8:
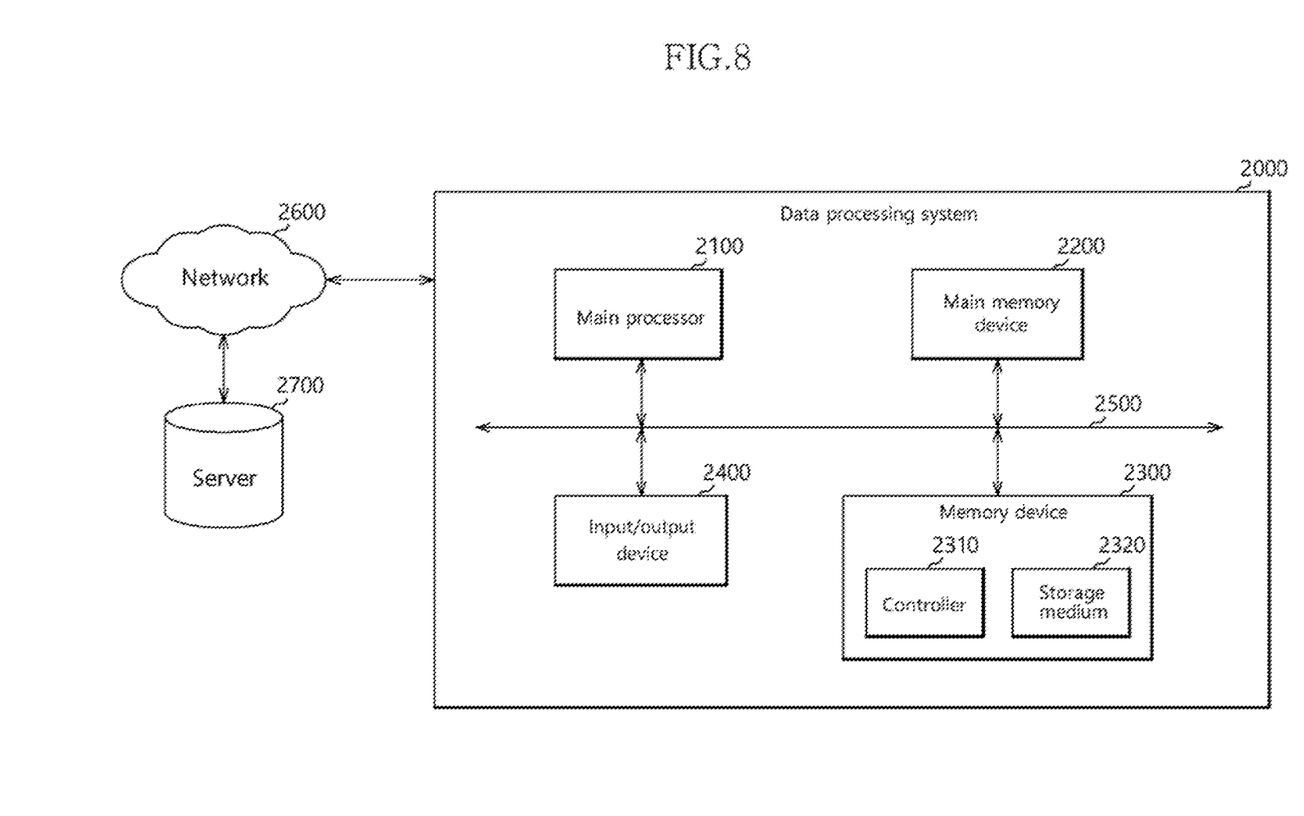
FIG. 8 is a block diagram illustrating a data processing system to which the data storage device according to an embodiment of the invention.

FIG. 8 is a block diagram illustrating a data processing system 2000 to which the data storage device 10 according to an embodiment of the invention.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be, for example, a central processing unit such as a microprocessor. The main processor 2100 may execute the softwares of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on.

The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:

1. A data storage device comprising:
a nonvolatile memory device suitable for reading a data chunk from a memory region using read voltage sets by applying one or more read voltages included in the read voltage sets to the memory region;
a first decoder suitable for performing first ECC decoding operation;
a second decoder suitable for performing second ECC decoding operation; and
a control unit suitable for controlling the first decoder to perform the first ECC decoding operation to data chunks read from the memory region respectively according to the read voltage sets, and scheduling the second ECC decoding operation to a current data chunk according to a syndrome weighting corresponding to the current data chunk when the first ECC decoding operation to the current data chunk fails, wherein the scheduling of the second ECC decoding operation includes performing one of prioritization, reservation and omission of the second ECC decoding operation to the current data chunk.

2. The data storage device according to claim 1, wherein when the syndrome weighting corresponding to the current data chunk falls in a first range representing a high success probability of the second ECC decoding operation to the current data chunk, the control unit controls the second decoder to perform the second ECC decoding operation to the current data chunk prior to the first ECC decoding operation according to remaining read voltage sets.

3. The data storage device according to claim 1, wherein when the syndrome weighting corresponding to the current data chunk falls in a second range representing a medium success probability of the second ECC decoding operation to the current data chunk, the control unit reserves the second ECC decoding operation to the current data chunk.

4. The data storage device according to claim 3, wherein the control unit further performs the reserved second ECC decoding operation to the current data chunk after failure of the first ECC decoding operation according to all of the read voltage sets.

5. The data storage device according to claim 3, wherein the control unit reserves the second ECC decoding operation to the current data chunk by adding an information on a current read voltage set to a reservation list.

6. The data storage device according to claim 1, wherein when the syndrome weighting corresponding to the current data chunk falls in a third range representing a very low success probability of the second ECC decoding operation to the current data chunk, the control unit omits the second ECC decoding operation to the current data chunk.

7. The data storage device according to claim 1, wherein the second ECC decoding operation has higher error correction capability than the first ECC decoding operation.

8. A method for operating a data storage device including a nonvolatile memory device suitable for reading a data chunk from a memory region using read voltage sets by applying one or more read voltages included in the read voltage sets to the memory region, the method comprising:

performing first ECC decoding operation to data chunks read from the memory region respectively according to the read voltage sets; and performing one of prioritization, reservation and omission of the second ECC decoding operation to a current data chunk according to a syndrome weighting corresponding to the current data chunk when the first ECC decoding operation to the current data chunk fails.

9. The method according to claim 8, wherein the performing of prioritization includes performing the second ECC decoding operation to the current data chunk prior to the first ECC decoding operation according to remaining read voltage sets when the syndrome weighting corresponding to the current data chunk falls in a first range representing a high success probability of the second ECC decoding operation to the current data chunk.

10. The method according to claim 8, wherein the performing of reservation includes reserving the second ECC decoding operation to the current data chunk when the syndrome weighting corresponding to the current data chunk falls in a second range representing a medium success probability of the second ECC decoding operation to the current data chunk.

11. The method according to claim 10, further comprising performing the reserved second ECC decoding operation to the current data chunk after failure of the first ECC decoding operation according to all of the read voltage sets.

12. The method according to claim 8, wherein the performing of omission includes omitting the second ECC decoding operation to the current data chunk when the syndrome weighting corresponding to the current data chunk falls in a third range representing a very low success probability of the second ECC decoding operation to the current data chunk.

13. The method according to claim 8, wherein the second ECC decoding operation has higher error correction capability than the first ECC decoding operation.

14. A method for operating a data storage device including a nonvolatile memory device suitable for reading a data chunk from a memory region using read voltage sets by applying one or more read voltages included in the read voltage sets to the memory region, the method comprising:

performing first ECC decoding operation to a data chunk read from the memory region according to a current read voltage set among the read voltage sets;

determining a syndrome weighting corresponding to the current read voltage set when the first ECC decoding operation fails; and performing the first ECC decoding operation according to remaining read voltage sets prior to second ECC decoding operation according to the current read voltage set or performing the second ECC decoding operation prior to the first ECC decoding operation according to the remaining read voltage sets, based on the syndrome weighting.

15. The method according to claim 14, wherein the second ECC decoding operation according to the current read voltage set is performed when the syndrome weighting falls in a first range representing a high success probability of the second ECC decoding operation according to the current read voltage set.

16. The method according to claim 14, when the second ECC decoding operation according to the current read voltage set is performed, further comprising performing the first ECC decoding operation according to remaining read voltage sets after failure of the second ECC decoding operation according to the current read voltage set.

17. The method according to claim 14, when the first ECC decoding operation according to the remaining read voltage sets is performed, further comprising reserving the second ECC decoding operation according to the current read voltage set when the syndrome weighting falls in a second range representing a medium success probability of the second ECC decoding operation according to the current read voltage set.

18. The method according to claim 17, further comprising performing the reserved second ECC decoding operation after failure of the first ECC decoding operation according to all of the read voltage sets.

19. The method according to claim 14, when the first ECC decoding operation according to the remaining read voltage sets is performed, further comprising omitting the second ECC decoding operation according to the current read voltage set when the syndrome weighting falls in a third range representing a very low success probability of the second ECC decoding operation according to the current read voltage set.

20. The method according to claim 14, wherein the second ECC decoding operation has higher error correction capability than the first ECC decoding operation.

* * * * *